US010260556B2

(12) United States Patent
Chen et al.

(10) Patent No.: US 10,260,556 B2
(45) Date of Patent: Apr. 16, 2019

(54) SLIDE RAIL ASSEMBLY AND MOUNTING METHOD FOR SLIDE RAILS (71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chih-Hsin Yeh, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/868,992

(22) Filed: Jan. 11, 2018

(65) Prior Publication Data

US 2019/0063493 A1 Feb. 28, 2019

(30) Foreign Application Priority Data

Aug. 28, 2017 (TW) .............................. 106129416 A (51) Int. Cl.
*A47B 88/40* (2017.01)
*F16C 29/02* (2006.01)
*A47B 96/07* (2006.01)
*A47B 88/483* (2017.01)

(52) U.S. Cl.
CPC ............ *F16C 29/02* (2013.01); *A47B 88/483* (2017.01); *A47B 96/07* (2013.01)

(58) Field of Classification Search
CPC . A47B 88/49; A47B 88/403; A47B 2210/007; A47B 2210/0051; A47B 2210/0054; A47B 2210/0059; A47B 88/483; A47B 96/07
USPC ..................... 312/334.1, 334.7, 334.8, 330.1
See application file for complete search history.

(56) References Cited

U.S. PATENT DOCUMENTS

| 4,962,974 A | * | 10/1990 | Fitz | .................. A47B 88/57 312/333 |
| 5,785,400 A | * | 7/1998 | Grieser | ................ A47B 88/487 312/330.1 |
| 5,876,103 A | * | 3/1999 | Domenig | ............. A47B 88/487 312/330.1 |
| 6,619,771 B2 | * | 9/2003 | Kueng | ................. A47B 88/402 312/330.1 |

(Continued)

FOREIGN PATENT DOCUMENTS

| EP | 1470771 | * 10/2004 |
| EP | 3 057 386 A1 | 8/2016 |

(Continued)

*Primary Examiner* — Janet M Wilkens
(74) *Attorney, Agent, or Firm* — Winston Hsu (57) ABSTRACT A slide rail assembly is disclosed and includes a first rail, a second rail and a guiding structure. The first rail includes a first wall, a second wall and a longitudinal wall connected between the first wall and the second wall. The first wall, the second wall and the longitudinal wall cooperatively define a channel, and the channel has a channel opening. The guiding structure is disposed adjacent to the channel opening of the channel and for guiding the second rail to be mounted into the channel via the channel opening.

29 Claims, 4 Drawing Sheets

(56) References Cited

U.S. PATENT DOCUMENTS

| | | | |
|---|---|---|---|
| 8,186,779 B2 | 5/2012 | Chen | |
| 8,282,176 B1* | 10/2012 | Chen | A47B 88/493 312/333 |
| 8,780,565 B2 | 7/2014 | Henderson | |
| 9,033,434 B2* | 5/2015 | Kruse | A47B 88/487 312/334.12 |
| 2011/0018414 A1* | 1/2011 | Kim | F25D 25/025 312/402 |
| 2012/0187816 A1* | 7/2012 | Chen | E05B 65/463 312/334.8 |
| 2015/0084494 A1 | 3/2015 | Tonthat | |

FOREIGN PATENT DOCUMENTS

| | | | |
|---|---|---|---|
| EP | 3 144 457 A1 | | 3/2017 |
| FR | 9399209 | * | 1/1992 |

* cited by examiner

SLIDE RAIL ASSEMBLY AND MOUNTING METHOD FOR SLIDE RAILS

BACKGROUND OF THE INVENTION

1. Field of the Invention

The present invention relates to a slide rail assembly and a mounting method for slide rails, and more particularly, to a slide rail assembly with one slide rail to be easily mounted to another slide rail and a mounting method thereof.

2. Description of the Prior Art

Figure 1:
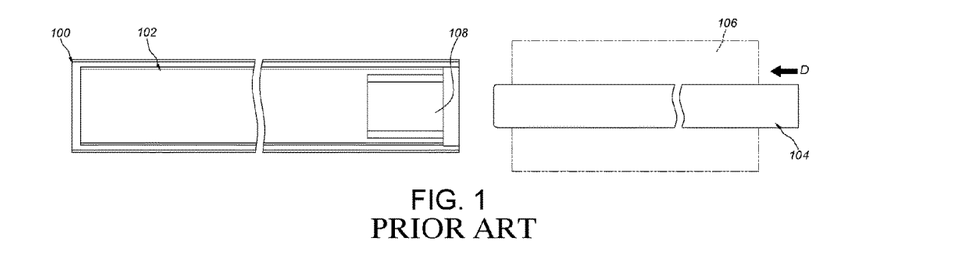
FIG. 1 is a diagram illustrating a rail of a slide rail assembly being separate from another rail in the prior art.

Generally speaking, a slide rail assembly can include a two-section slide or a three-section slide. As shown in FIG. 1, in terms of the three-section slide, the three-section slide includes a first rail 100, a second rail 102 and a third rail 104. The first rail 100, the second rail 102 and the third rail 104 are movable with one another. The second rail 102 is movably mounted between the first rail 100 and the third rail 104. The third rail 104 is for mounting a carrier 106, such that the carrier 106 is able to be extended or retracted relative to a fixing object, such as a rack or a cabinet, wherein the third rail 104 is able to be detached from the second rail 102 via a channel opening 108.

Figure 2:
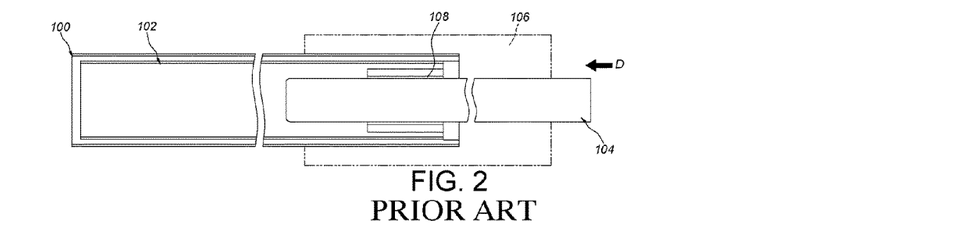
FIG. 2 is a diagram illustrating the rail of the slide rail assembly being mounted via a channel opening of the other rail in the prior art.

However, as shown in FIG. 1 and FIG. 2, when the third rail 104 is desired to be mounted to the second rail 102 in a direction D, it is incommoded for a user to align the third rail 104 with the channel opening 108 of the second rail 102 since the carrier 106 blocks the user's sight or due to other factors. Thus, it causes inconvenience of assembly of the rails.

SUMMARY OF THE INVENTION

The present invention provides a slide rail assembly with one slide rail to be easily mounted to another slide rail and a mounting method thereof.

According to an embodiment of the present invention, a slide rail assembly includes a first rail, a second rail and a guiding structure. The first rail includes a first wall, a second wall and a longitudinal wall connected between the first wall and the second wall. The first wall, the second wall and the longitudinal wall cooperatively define a channel, and the channel has a channel opening. The guiding structure is disposed adjacent to the channel opening of the channel and for guiding the second rail to be mounted into the channel via the channel opening.

Preferably, the guiding structure includes a first guiding portion, and the first guiding portion is disposed adjacent to one of the first wall and the second wall.

Preferably, the first guiding portion includes an inclined surface or a cambered surface.

Preferably, the first guiding portion extends from one of the first wall and the second wall and is located beyond the channel opening.

Preferably, the guiding structure further includes a second guiding portion, and the second guiding portion is disposed adjacent to the other one of the first wall and the second wall.

Preferably, the second guiding portion includes an inclined surface or a cambered surface.

Preferably, the second guiding portion extends from the other one of the first wall and the second wall and is located beyond the channel opening.

Preferably, the guiding structure further includes a third guiding portion, and the third guiding portion is disposed adjacent to the longitudinal wall.

Preferably, the third guiding portion includes an inclined surface or a cambered surface.

Preferably, the third guiding portion extends from the longitudinal wall and is located beyond the channel opening.

Preferably, the slide rail assembly further includes a third rail. The first rail is mounted between the third rail and the second rail.

Preferably, the third rail includes a first lateral wall, a second lateral wall and a central wall connected between the first lateral wall and the second lateral wall. The guiding structure has an edge, and the edge is in a position substantially corresponding to the central wall of the third rail.

According to an embodiment of the present invention, a slide rail assembly includes a first rail, a second rail and a guiding structure. The first rail includes a first wall, a second wall and a longitudinal wall. The longitudinal wall has a longitudinal direction, a height direction and a transverse direction and being connected between the first wall and the second wall. The longitudinal wall is oriented substantially parallel to the longitudinal direction. The height direction is substantially perpendicular to the longitudinal direction and passes through the first wall and the second wall. The transverse direction is substantially perpendicular to the longitudinal direction and the height direction. The first wall, the second wall and the longitudinal wall cooperatively define a channel. The guiding structure is disposed on the first rail. The guiding structure is for guiding the second rail from outside the channel to inside the channel in at least one of the height direction and the transverse direction of the longitudinal wall, so that the second rail is mounted to the first rail.

According to an embodiment of the present invention, amounting method for slide rails includes providing a first rail with a longitudinal wall oriented substantially parallel to a longitudinal direction, the first rail includes a channel; providing a guiding structure to be disposed on the first rail; and providing a second rail, the guiding structure guiding the second rail into the channel of the first rail in at least one of a height direction and a transverse direction, wherein the longitudinal direction, the height direction and the transverse direction are substantially perpendicular to one another.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
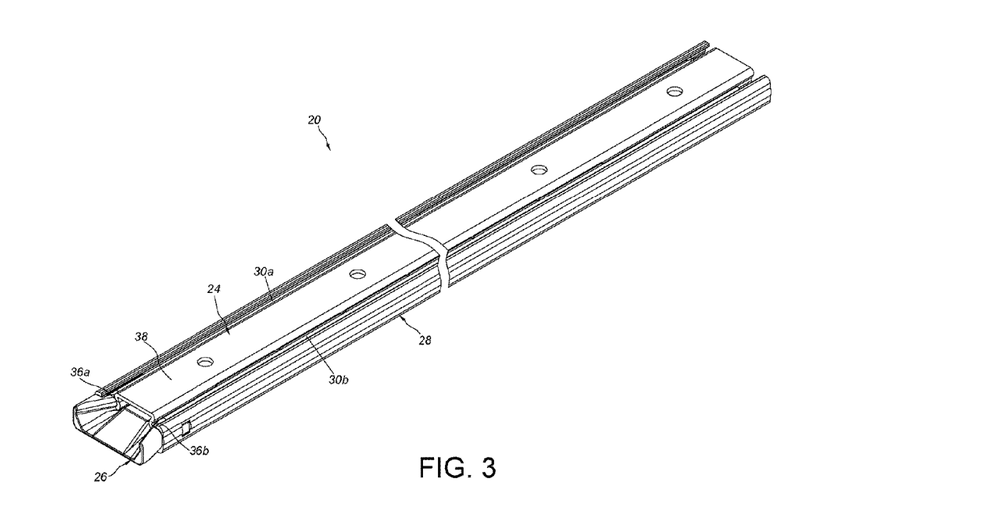
FIG. 3 is a schematic diagram of a slide rail assembly according to an embodiment of the present invention.
Figure 4:
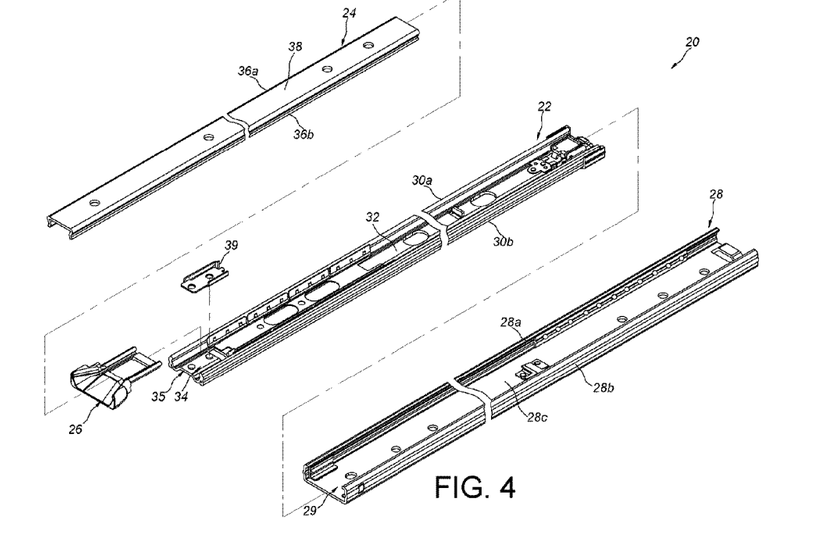
FIG. 4 is an exploded diagram illustrating a first rail, a second rail and a third rail of the slide rail assembly according to the embodiment of the present invention.

As shown in FIG. 3 and FIG. 4, the slide rail assembly 20 includes a first rail 22, a second rail 24 and a guiding structure 26. Preferably, the slide rail assembly 20 further includes a third rail 28, and the first rail 22 is movably mounted between the third rail 28 and the second rail 24.

The third rail 28 includes a first lateral wall 28a, a second lateral wall 28b and a central wall 28c. The central wall 28c is connected between the first lateral wall 28a and the second lateral wall 28b, and the first lateral wall 28a, the second lateral wall 28b and the central wall 28c cooperatively define a rail passage 29.

The first rail 22 is mounted in the rail passage 29 of the third rail 28. The first rail 22 includes a first wall 30a, a second wall 30b and a longitudinal wall 32. The longitudinal wall 32 is connected between the first wall 30a and the second wall 30b. The first wall 30a, the second wall 30b and the longitudinal wall 32 cooperatively define a channel 34, and the channel 34 has a channel opening 35.

The second rail 24 is mounted to the channel 34 of the first rail 22. The second rail 24 includes a third wall 36a, a fourth wall 36b and a side wall 38. The side wall 38 is connected between the third wall 36a and the fourth wall 36b.

The guiding structure 26 is disposed on the first rail 22. The guiding structure 26 disposed adjacent to the channel opening 35 of the channel 34 of the first rail 22 is illustrative of an example hereinafter. The guiding structure 26 and the first rail 22 can be integrally formed. Alternatively, the guiding structure 26 is not integrally formed with the first rail 22, for example, the guiding structure 26 is securely connected to the first rail 22 in a manner of an ancillary including a riveted member 39. The ancillary including a riveted member 39 is illustrative, but the present invention is not limited thereto.

Figure 5:
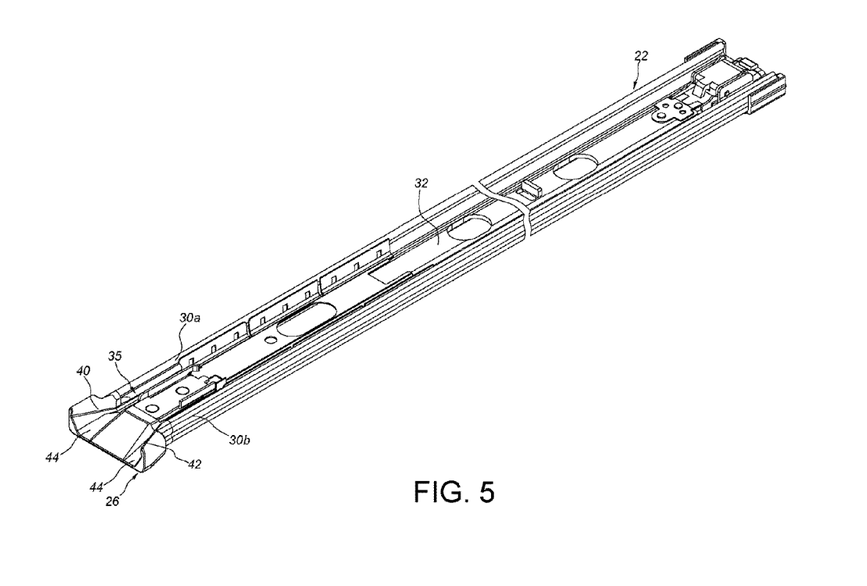
FIG. 5 is a diagram illustrating the first rail of the slide rail assembly according to the embodiment of the present invention.

As shown in FIG. 5, the guiding structure 26 includes a first guiding portion 40, a second guiding portion 42 and a third guiding portion 44 which can be omitted in the present invention. In the present embodiment, the guiding structure 26 is illustrative of including the first guiding portion 40, the second guiding portion 42 and the third guiding portion 44, but the present invention is not limited thereto. The first guiding portion 40 and the second guiding portion 42 are disposed on two opposite sides of the third guiding portion 44. Preferably, the first guiding portion 40 and the second guiding portion 42 have substantially identical configuration of structures.

Preferably, the first guiding portion 40 is disposed adjacent to one of the first wall 30a and the second wall 30b of the first rail 22, e.g., the first guiding portion 40 is disposed adjacent to a front end of the first wall 30a. The second guiding portion 42 is disposed adjacent to the other one of the first wall 30a and the second wall 30b of the first rail 22, e.g., the second guiding portion 42 is disposed adjacent to a front end of the second wall 30b. The third guiding portion 44 is disposed adjacent to a front end of the longitudinal wall 32 of the first rail 22.

Preferably, the first guiding portion 40 extends from the first wall 30a of the first rail 22 and is located beyond the channel opening 35. The second guiding portion 42 extends from the second wall 30b of the first rail 22 and is located beyond the channel opening 35. The third guiding portion 44 extends from the longitudinal wall 32 of the first rail 22 and is located beyond the channel opening 35.

Figure 6:
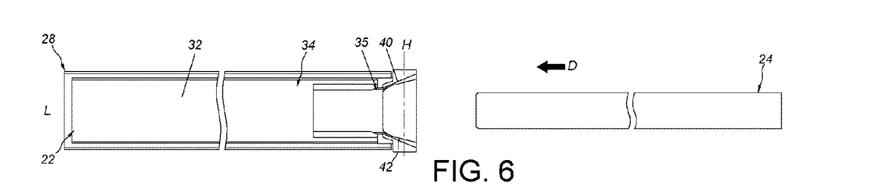
FIG. 6 is a diagram illustrating the second rail being separate from the first rail and the third rail according to the embodiment of the present invention.

As shown in FIG. 6, the first rail 22 and the third rail 28 are in a retracted status. The second rail 24 is separate from the channel 34 of the first rail 22 via the channel opening 35 and is located outside the channel 34. In other words, the second rail 24 is detachable from the first rail 22, and the aforesaid detaching mechanism is known to those skilled in the art and omitted herein for simplicity.

Figure 7:
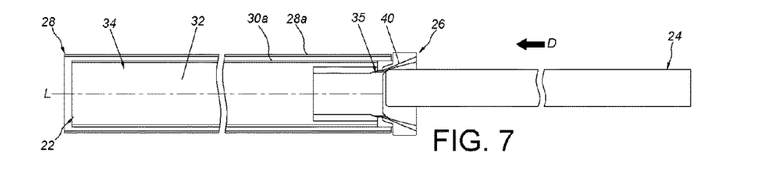
FIG. 7 is a diagram illustrating the second rail being guided by the first guiding portion of the guiding structure and approaching the channel of the first rail according to the embodiment of the present invention.
Figure 8:
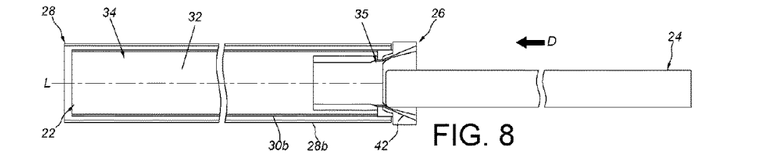
FIG. 8 is a diagram illustrating the second rail being guided by the second guiding portion of the guiding structure and approaching the channel of the first rail according to the embodiment of the present invention.

As shown in FIG. 6, FIG. 7 and FIG. 8, in a first configuration of the first rail 22 and the second rail 24, when the second rail 24 is desired to be mounted to the first rail 22 in a direction D, the second rail 24 is guided by the first guiding portion 40 (as shown in FIG. 7) or the second guiding portion 42 (as shown in FIG. 8) of the guiding structure 26 to allow the second rail 24 to be mounted in the channel 34 of the first rail 22 via the channel opening 35. In addition, the longitudinal wall 32 of the first rail 22 has a longitudinal direction L and a height direction H. The longitudinal wall 32 is oriented substantially parallel to the longitudinal direction L. The height direction H is substantially perpendicular to the longitudinal direction L and passes through the first wall 30a and the second wall 30b of the first rail 22. Furthermore, during process of the second rail 24 being mounted to the first rail 22, the guiding structure 26 is able to be used for guiding the second rail 24 from outside the channel 34 to inside the channel 34 in the height direction H which is substantially perpendicular to the longitudinal direction L of the longitudinal wall 32 of the first rail 22.

For example, the first guiding portion 40 includes an inclined surface or a cambered surface. During the process of the second rail 24 being mounted to the first rail 22, an end portion of the second rail 24 is guided by the first guiding portion 40 of the guiding structure 26, as shown in FIG. 7, such that the second rail 24 is guided downwards from outside the channel 34 (or outside the channel opening 35) of the first rail 22 to approach the channel 34. One of the advantages of the aforesaid design is to prevent the end portion of the second rail 24 from hitting a front end of the first wall 30a of the first rail 22 or to prevent the end portion of the second rail 24 from hitting a front end of the first lateral wall 28a of the third rail 28. In addition, the second guiding portion 42 includes an inclined surface or a cambered surface. During the process of the second rail 24 being mounted to the first rail 22, the end portion of the second rail 24 is guided by the second guiding portion 42 of the guiding structure 26, as shown in FIG. 8, such that the second rail 24 is guided upwards from outside the channel 34 (or outside the channel opening 35) of the first rail 22 to approach the channel 34. One of the advantages of the aforesaid design is to prevent the end portion of the second rail 24 from hitting a front end of the second wall 30b of the first rail 22 or to prevent the end portion of the second rail 24 from hitting a front end of the second lateral wall 28b of the third rail 28.

Figure 9:
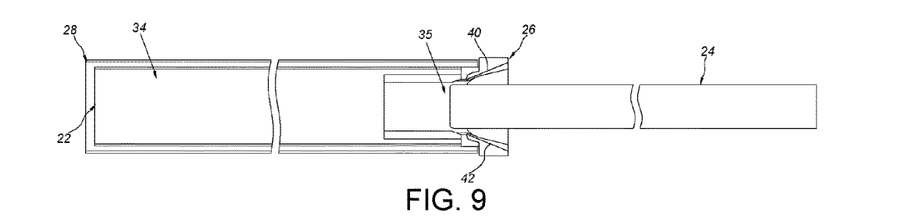
FIG. 9 is a diagram illustrating the second rail being guided by the second guiding portion of the guiding structure and entering the channel of the first rail according to the embodiment of the present invention.
Figure 10:
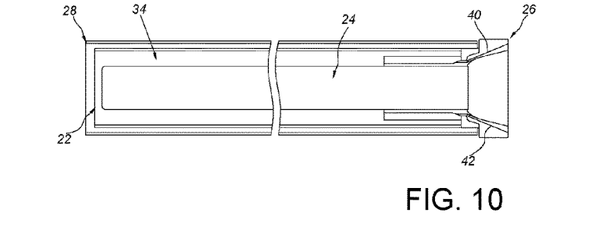
FIG. 10 is a diagram illustrating the second rail being retracted in the channel of the first rail according to the embodiment of the present invention.

As shown in FIG. 9 and FIG. 10, after the second rail 24 is guided from outside the channel 34 (or from outside of the channel opening 35) of the first rail 22 to inside the channel 34 by the first guiding portion 40 or by the second guiding portion 42, the working process of the second rail 24 being mounted to the first rail 22 is completed.

Figure 11:
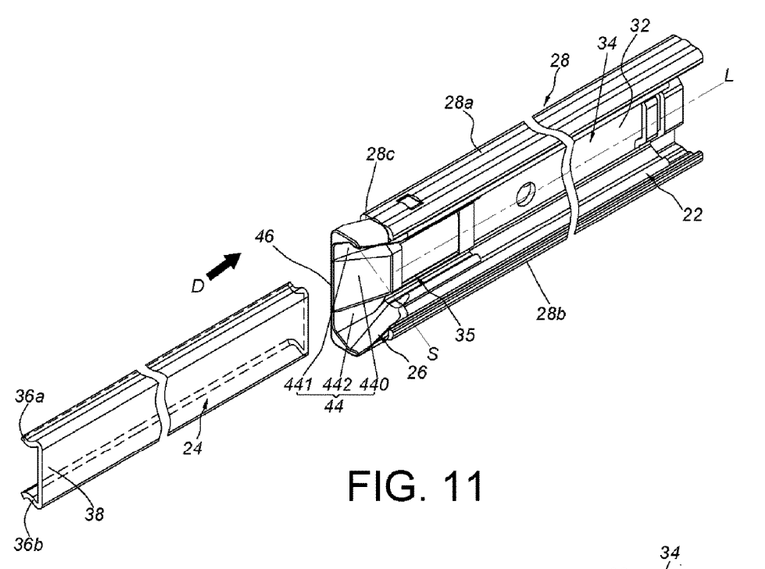
FIG. 11 is a diagram illustrating the second rail being moved toward the channel of the first rail according to the embodiment of the present invention.
Figure 12:
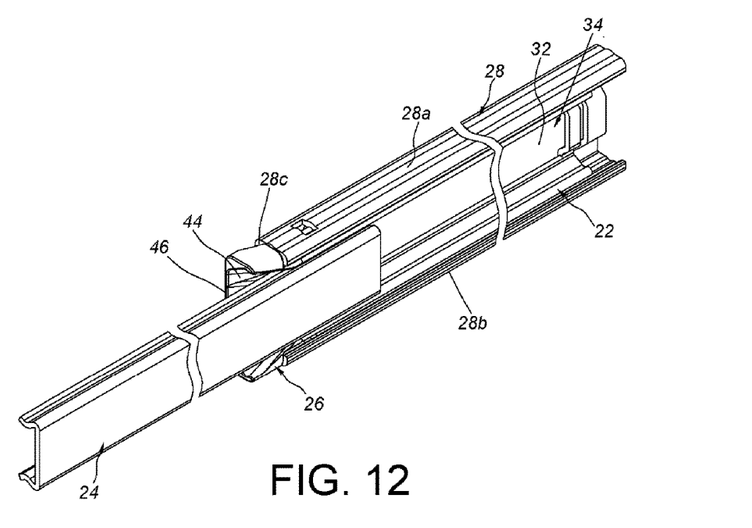
FIG. 12 is a diagram illustrating the second rail is guided to be mounted to the channel of the first rail by the third guiding portion of the guiding structure according to the embodiment of the present invention.

As shown in FIG. 11 and FIG. 12, the first rail 22 and the third rail 28 are in the retracted status. The longitudinal wall 32 of the first rail 22 further has a transverse direction S. The transverse direction S is substantially perpendicular to the longitudinal direction L and the height direction H. In a second configuration of the first rail 22 and the second rail 24, when the second rail 24 is desired to be mounted to the first rail 22 in the direction D, the second rail 24 is guided by the third guiding portion 44 of the guiding structure 26 to allow the second rail 24 to be mounted in the channel 34 of the first rail 22 via the channel opening 35. Furthermore, during the process of the second rail 24 being mounted to the first rail 22, the guiding structure 26 is able to be used for guiding the second rail 24 from outside the channel 34 to inside the channel 34 in the transverse direction S which is substantially perpendicular to the longitudinal direction L of the longitudinal wall 32 of the first rail 22. Preferably, the guiding structure 26 has an edge 46 adjacent to the third guiding portion 44, and the edge 46 is located in a position substantially corresponding to the central wall 28c of the third rail 28. Furthermore, the edge 46 is located in front of the central wall 28c of the third rail 28.

For example, the third guiding portion 44 includes an inclined surface or a cambered surface. During the process of the second rail 24 being mounted to the first rail 22, the end portion of the second rail 24 is guided by the third guiding portion 44 of the guiding structure 26, such that the second rail 24 is laterally guided from outside the channel 34 (or outside the channel opening 35) of the first rail 22 to approach the channel 34. One of the advantages of the aforesaid design is to prevent the end portion of the second rail 24 from hitting a front end of the longitudinal wall 32 of the first rail 22 or to prevent the end portion of the second rail 24 from hitting a front end of the central wall 28c of the third rail 28.

It should be noticed that the third guiding portion 44 can include a first inclined surface 440, a second inclined surface 441 and a third inclined surface 442. The first inclined surface 440 corresponds to the side wall 38 of the second rail 24. The second inclined surface 441 and the third inclined surface 442 are disposed on opposite sides of the first inclined surface 440. The second inclined surface 441 corresponds to the third wall 36a of the second rail 24. The third inclined surface 442 corresponds to the fourth wall 36b of the second rail 24. During the process of the second rail 24 being mounted to the first rail 22, the first inclined surface 440, the second inclined surface 441 and the third inclined surface 442 may laterally guide the side wall 38, the third wall 36a and the fourth wall 36b, so as to enhance the guiding effect of the third guiding portion 44 on the end of the second rail 24 and thus to facilitate the second rail 24 to be mounted to the first rail 22.

In addition, the present invention further provides a mounting method for slide rails. The mounting method includes providing a first rail 22 with a longitudinal wall 32. The longitudinal wall 32 is oriented substantially parallel to a longitudinal direction L. The first rail 22 includes a channel 34. The mounting method further includes providing a guiding structure 26 to be disposed on the first rail 22 and providing a second rail 24. The guiding structure 26 guides the second rail 24 into the channel 34 of the first rail 22 in at least one of a height direction H and a transverse direction S, wherein the longitudinal direction L, the height direction H and the transverse direction S are substantially perpendicular to one another. The detailed descriptions for the mounting method are illustrated in the above-mentioned paragraphs and omitted herein for simplicity.

Compared to the prior art, the slide rail assembly has advantages over the prior art by the following perspectives:

1. The guiding structure 26 facilitates the second rail 24 to be mounted to the first rail 22 from outside the channel 34 to inside the channel 34.

2. The guiding structure 26 is able to guide the second rail 24 into the channel 34 of the first rail 22 in a direction different from the longitudinal direction L (e.g., the height direction H or the transverse direction S).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
   a first rail comprising a first wall, a second wall and a longitudinal wall connected between the first wall and the second wall, the first wall, the second wall and the longitudinal wall cooperatively defining a channel, the channel having a channel opening;
   a second rail; and
   a guiding structure disposed adjacent to the channel opening of the channel and for guiding the second rail to be mounted into the channel via the channel opening;
   wherein the guiding structure comprises a first guiding portion, and the first guiding portion is disposed adjacent to one of the first wall and the second wall, the guiding structure further comprises a second guiding portion, and the second guiding portion is disposed adjacent to the other one of the first wall and the second wall;
   wherein the guiding structure comprises a third guiding portion, and the third guiding portion is disposed adjacent to the longitudinal wall, the third guiding portion comprises an inclined surface or a cambered surface.

2. The slide rail assembly of claim 1, wherein the first guiding portion comprises an inclined surface or a cambered surface.

3. The slide rail assembly of claim 1, wherein the first guiding portion extends from one of the first wall and the second wall and is located beyond the channel opening.

4. The slide rail assembly of claim 1, wherein the second guiding portion comprises an inclined surface or a cambered surface.

5. The slide rail assembly of claim 1, wherein the first guiding portion extends from one of the first wall and the second wall and is located beyond the channel opening, and the second guiding portion extends from the other one of the first wall and the second wall and is located beyond the channel opening.

6. The slide rail assembly of claim 1, wherein the third guiding portion extends from the longitudinal wall and is located beyond the channel opening.

7. The slide rail assembly of claim 1, further comprising a third rail, the first rail being mounted between the third rail and the second rail.

8. The slide rail assembly of claim 7, wherein the third rail comprises a first lateral wall, a second lateral wall and a central wall connected between the first lateral wall and the second lateral wall, the guiding structure has an edge, and the edge is in a position substantially corresponding to the central wall of the third rail.

9. A slide rail assembly, comprising:
a first rail comprising a first wall, a second wall and a longitudinal wall, the longitudinal wall having a longitudinal direction, a height direction and a transverse direction and being connected between the first wall and the second wall, the longitudinal wall being oriented substantially parallel to the longitudinal direction, the height direction being substantially perpendicular to the longitudinal direction and passing through the first wall and the second wall, the transverse direction being substantially perpendicular to the longitudinal direction and the height direction, the first wall, the second wall and the longitudinal wall cooperatively defining a channel;
a second rail; and
a guiding structure disposed on the first rail, the guiding structure being for guiding the second rail from outside the channel to inside the channel in at least one of the height direction and the transverse direction of the longitudinal wall, so that the second rail is mounted to the first rail;
wherein the guiding structure comprises a first guiding portion, and the first guiding portion is disposed adjacent to one of the first wall and the second wall, the guiding structure further comprises a second guiding portion, and the second guiding portion is disposed adjacent to the other one of the first wall and the second wall;
wherein the guiding structure comprises a third guiding portion, and the third guiding portion is disposed adjacent to the longitudinal wall, the third guiding portion comprises an inclined surface or a cambered surface.

10. The slide rail assembly of claim 9, wherein the first guiding portion comprises an inclined surface or a cambered surface.

11. The slide rail assembly of claim 9, further comprising a third rail, the first rail being mounted between the third rail and the second rail.

12. A mounting method for slide rails, comprising:
providing a first rail with a longitudinal wall oriented substantially parallel to a longitudinal direction, the first rail comprises a channel;
providing a guiding structure to be disposed on the first rail; and
providing a second rail, the guiding structure guiding the second rail into the channel of the first rail in at least one of a height direction and a transverse direction, wherein the longitudinal direction, the height direction and the transverse direction are substantially perpendicular to one another;
providing a first guiding portion, a second guiding portion and third guiding portion disposed on the guiding structure, wherein the first guiding portion is disposed adjacent to one of the first wall and the second wall, the second guiding portion is disposed adjacent to the other one of the first wall and the second wall, the third guiding portion is disposed adjacent to the longitudinal wall, the third guiding portion comprises an inclined surface or a cambered surface.

13. A slide rail assembly, comprising:
a first rail comprising a first wall, a second wall and a longitudinal wall connected between the first wall and the second wall, the first wall, the second wall and the longitudinal wall cooperatively defining a channel, the channel having a channel opening;
a second rail;
a third rail, the first rail being mounted between the third rail and the second rail; and
a guiding structure disposed adjacent to the channel opening of the channel and for guiding the second rail to be mounted into the channel via the channel opening.

14. The slide rail assembly of claim 13, wherein the guiding structure comprises a first guiding portion, and the first guiding portion is disposed adjacent to one of the first wall and the second wall.

15. The slide rail assembly of claim 14, wherein the first guiding portion comprises an inclined surface or a cambered surface.

16. The slide rail assembly of claim 14, wherein the first guiding portion extends from one of the first wall and the second wall and is located beyond the channel opening.

17. The slide rail assembly of claim 14, wherein the guiding structure further comprises a second guiding portion, and the second guiding portion is disposed adjacent to the other one of the first wall and the second wall.

18. The slide rail assembly of claim 17, wherein the second guiding portion comprises an inclined surface or a cambered surface.

19. The slide rail assembly of claim 17, wherein the first guiding portion extends from one of the first wall and the second wall and is located beyond the channel opening, and the second guiding portion extends from the other one of the first wall and the second wall and is located beyond the channel opening.

20. The slide rail assembly of claim 13, wherein the guiding structure comprises a third guiding portion, and the third guiding portion is disposed adjacent to the longitudinal wall.

21. The slide rail assembly of claim 20, wherein the third guiding portion comprises an inclined surface or a cambered surface.

22. The slide rail assembly of claim 20, wherein the third guiding portion extends from the longitudinal wall and is located beyond the channel opening.

23. The slide rail assembly of claim 13, wherein the third rail comprises a first lateral wall, a second lateral wall and a central wall connected between the first lateral wall and the second lateral wall, the guiding structure has an edge, and the edge is in a position substantially corresponding to the central wall of the third rail.

24. A slide rail assembly, comprising:
a first rail comprising a first wall, a second wall and a longitudinal wall, the longitudinal wall having a longitudinal direction, a height direction and a transverse direction and being connected between the first wall and the second wall, the longitudinal wall being oriented substantially parallel to the longitudinal direction, the height direction being substantially perpendicular to the longitudinal direction and passing through the first wall and the second wall, the transverse direction being substantially perpendicular to the longitudinal direction and the height direction, the first wall, the second wall and the longitudinal wall cooperatively defining a channel;
a second rail;
a third rail, the first rail being mounted between the third rail and the second rail; and
a guiding structure disposed on the first rail, the guiding structure being for guiding the second rail from outside the channel to inside the channel in at least one of the height direction and the transverse direction of the longitudinal wall, so that the second rail is mounted to the first rail.

25. The slide rail assembly of claim 24, wherein the guiding structure comprises a first guiding portion, and the first guiding portion is disposed adjacent to one of the first wall and the second wall.

26. The slide rail assembly of claim 25, wherein the first guiding portion comprises an inclined surface or a cambered surface.

27. The slide rail assembly of claim 25, wherein the guiding structure further comprises a second guiding portion, and the second guiding portion is disposed adjacent to the other one of the first wall and the second wall.

28. The slide rail assembly of claim 24, wherein the guiding structure comprises a third guiding portion, and the third guiding portion is disposed adjacent to the longitudinal wall.

29. The slide rail assembly of claim 28, wherein the third guiding portion comprises an inclined surface or a cambered surface.

* * * * *